(12) United States Patent
Hashemi

(10) Patent No.: US 6,252,178 B1
(45) Date of Patent: Jun. 26, 2001

(54) SEMICONDUCTOR DEVICE WITH BONDING ANCHORS IN BUILD-UP LAYERS

(75) Inventor: Hassan S. Hashemi, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/373,303

(22) Filed: Aug. 12, 1999

(51) Int. Cl.[7] ............................. H05R 1/16; H01R 9/09

(52) U.S. Cl. .................. 174/260; 174/262; 174/264; 361/773; 257/698

(58) Field of Search ...................... 174/260, 262, 174/263, 264, 265; 361/773, 803; 259/698

(56) References Cited

U.S. PATENT DOCUMENTS

| | | | |
|---|---|---|---|
| 5,263,243 | * 11/1993 | Taneda et al. | 29/830 |
| 5,896,276 | * 4/1999 | Tamura et al. | 361/767 |
| 6,014,318 | * 1/2000 | Takeda | 361/764 |
| 6,156,980 | * 12/2000 | Peugh et al. | 174/252 |

* cited by examiner

Primary Examiner—Jeffrey Gaffin
Assistant Examiner—Kamand Cuneo
(74) Attorney, Agent, or Firm—Snell & Wilmer L.L.P.

(57) ABSTRACT

A semiconductor device and method that provides for the manufacture of semiconductor devices using high temperature wire bonding in combination with build-up layers having a low glass transition temperature. Anchors are created to serve as thermal gateways, during wire bonding, for bonding pads located on the upper surface of the build-up layers. The anchors pass through the thickness of the build-up layers and contact the PCB core layer.

16 Claims, 6 Drawing Sheets

SEMICONDUCTOR DEVICE WITH BONDING ANCHORS IN BUILD-UP LAYERS

BACKGROUND OF THE INVENTION

1. Field of the Invention

The present invention generally relates to semiconductor devices, and more particularly, to semiconductor devices that enable high temperature wire bonding regardless of the material used for build-up layers.

2. Description of the Related Art

The microelectronics industry has continued to make significant advances in semiconductor device technology. Semiconductor devices are getting smaller, more dense, and run at higher speeds. The semiconductor device typically comprises a chip attached to one or more layers of a printed circuit board (PCB) that is, in turn, plugged into a panel board.

New "Build-Up" technologies are now emerging to provide for the increased density of semiconductor devices. One such technology is the well known surface laminar circuit (SLC) technology. SLC uses photo patterning to embed fine lines of wiring on both sides of a PCB. Multiple build-up levels of fine line wiring can be created on each side of the PCB. SLC technology provides for improved route and escape capabilities due to smaller geometries and via sizes.

Referring to FIG. 1, a PCB core 10 is depicted with multiple build-up layers 20, 25, 30, 35 on each side. The SLC process starts with a conventional PCB core such as a FR4 printed wiring board. A photosensitive dielectric (laminate material) is applied over the PCB surface, and small microvias 40, typically 100 microns in diameter, are formed through the dielectric material to the layer directly below by exposure and developing of the dielectric material. Multiple build-up layers can be formed on each side of the PCB core.

There are a number of different ways to electrically connect chips to the PCB. One advantageous method is to wire bond from the terminals on the chip to bonding pads on the dielectric layer by using thin wires, typically aluminum, gold or copper. Two common methods of bonding the wire to the bonding pads are thermal compression and ultrasonic welding. Thermal compression or high temperature (i.e., 150–190 degrees C.) wire bonding works in many cases, but cannot be performed on photosensitive dielectric materials such as the ones used in the SLC process. The photosensitive dielectric materials are soft and have a low glass transition temperature ($T_g$), typically in the range of 80–110 degrees C. The heat generated during wire bonding quickly spreads from the bonding pad to the surrounding dielectric layer. Since the dielectric material has a low $T_g$, the dielectric softens causing the bonding pad and other features in the area to move or otherwise become unstable.

Ultrasonic welding or lower temperature wire bonding can be performed at temperatures as low as room temperature, and thus solves the problem of the low glass transition temperature. However, ultrasonic welding presents other problems. The dielectric material is now exposed to the stress of the high frequency ultrasonic energy that is required for ultrasonic welding. The dielectric materials used for the SLC process do not consistently hold up under the mechanical vibrations produced at this high frequency. The materials will often break down, resulting in a much lower manufacturing yield. Ultrasonic welding also requires more expensive machinery than the high temperature wire bonding.

Although thermal compression wire bonding has recently been performed at a lower stage temperature (i.e., 80–95 degrees C.) and with a higher wire bonder frequency, problems with the new technique are confronted that adversely affect the bonding throughput (e.g., from 8–10 bonds/second down to 1–2 bonds/second). In addition, the higher wire bonder frequency requires different wire bonders that are more expensive.

As a result of the foregoing shortcomings of the prior art, it is not possible to combine the robust and commonly used process of high temperature wire bonding with the high density SLC build-up technology. At best, ultrasonic welding can be performed on the SLC packages resulting in a low through put and a high rate of material breakdown.

Thus, there exists a need for a structure and a high yielding process which combines the desirable properties of wire bonding with any high density microvia PCB technology, but which does not unnecessarily add to the cost of the fabrication process.

SUMMARY OF THE INVENTION

It is an advantage of the present invention to provide for a semiconductor device that enables high temperature wire bonding to be used in conjunction with build-up layers having a low glass transition temperature. The addition of bonding anchors that are located under bonding pads and that contact the PCB core layer, provides this advantage by serving as thermal gateways for the heat generated by the wire bonding.

The above and other advantages of the present invention may be achieved in one form by a semiconductor device having one or more build-up layers formed over a PCB core layer, and one or more anchors passing through the thickness of the build-up layers such that the anchors contact the PCB core layer. A die attach pad is provided on the upper surface of the build-up layers and a semiconductor device chip is attached to this pad. A plurality of bond pads are formed on the upper surface of the build-up layers such that the bond pads are located immediately above the anchors. The chip is electrically connected to the bond pads by the commonly known technique of high temperature or thermal compression wire bonding.

BRIEF DESCRIPTION OF THE DRAWINGS

A more complete understanding of the present invention may be derived by referring to the detailed description and claims when considered in connection with the following illustrative Figures, which may not be to scale. In the following Figures, like reference numbers refer to similar elements throughout the Figures.

FIG. 6 illustrates, in top view, a bonding anchor of the device of FIG. 2a.

DETAILED DESCRIPTION

The present invention overcomes the difficulties described above that are associated with high temperature wire bonding when utilized with a semiconductor device containing build-up layers formed from materials with a low glass transition temperature. By addressing these problems, the semiconductor device of the current invention is capable of combining a high density build-up technology, such as the SLC technology, with a robust high temperature wire bonding technique regardless of the material used for the build-up layers.

Many conventional techniques, such as the well known SLC technology, associated with the design and packaging of semiconductor devices may be employed in a practical device that is configured in accordance with the present invention. Such conventional techniques, which are generally known to those skilled in the art, will not be described in detail herein. An exemplary method of practicing the present invention will now be described in conjunction with the cross sectional diagrams shown in FIGS. 2a–2e. The exemplary method will be described in the context of a photosensitive laminate process such as SLC, but it should be understood that many other conventional methods, such as plasma or laser drilling could also be utilized.

Figure 1:
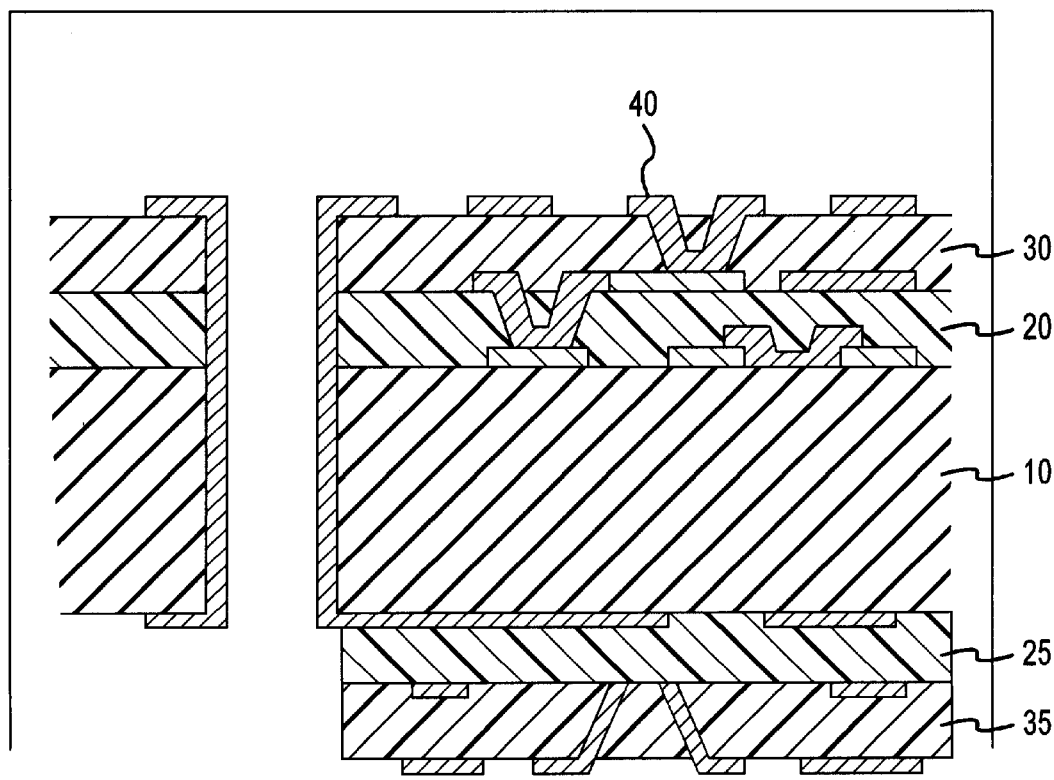
FIG. 1 illustrates, in cross section, a portion of a prior art semiconductor device having microvias.
Figure 2A:
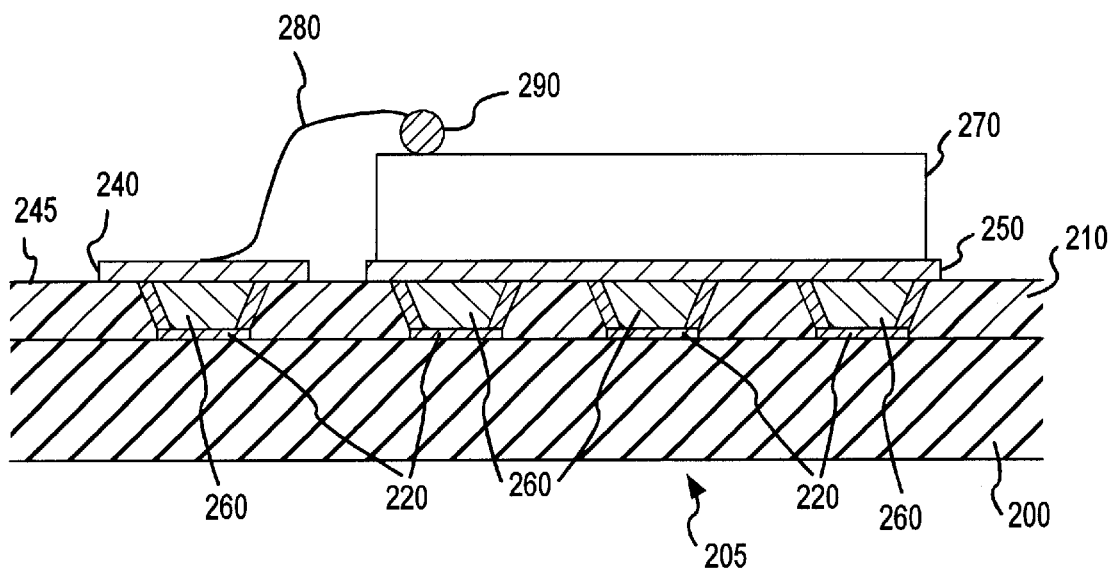
FIG. 2a illustrates, in cross section, an exemplary semiconductor device in accordance with one embodiment of this invention.
Figure 2B:
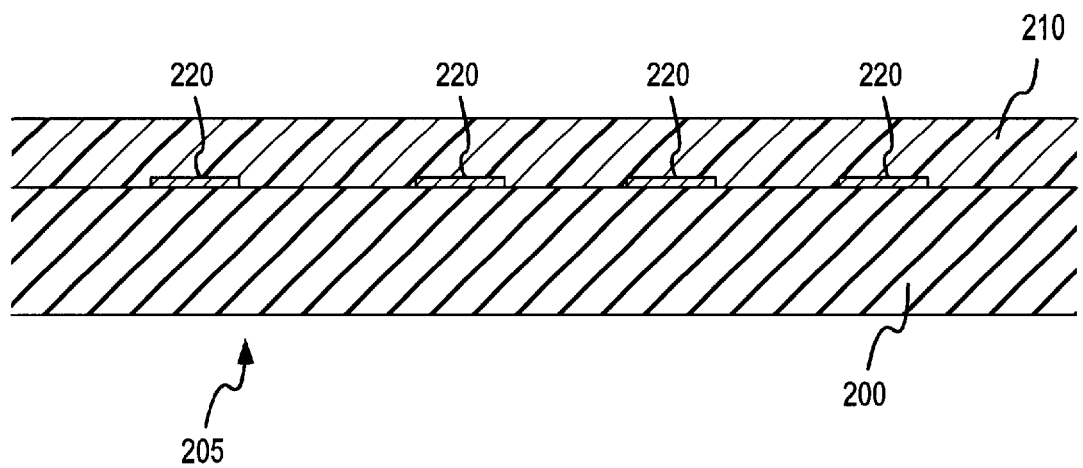
FIGS. 2b–2e illustrate, in cross sections, the device of FIG. 2a during various stages in the manufacturing process.

FIG. 2a presents a cross sectional view of a semiconductor device 205 in accordance with a first embodiment of this invention. Initially, as depicted in FIG. 2b, a first build-up layer 210 and metallic features 220 are formed on a PCB core layer 200. As one skilled in the art will appreciate, many different types of core layers and build-up layer materials could be used. More specifically, the core layer can be an organic resin based material such as BT or FR4, or the core layer can be a ceramic material such as alumina ($Al_2O_3$) dielectric or Cordierite glass dielectric. The build-up layers can be organic or inorganic. An example of an organic material is a laminate material that is photosensitive and can be patterned by conventional photolithographic processes. An example of inorganic materials that can be used in the build-up layer are ceramic materials, such as the alumina dielectric or the Cordierite glass dielectric that could also be used in the core layer. In many current applications, a laminate material is preferred due to ease of manufacturing and the electrical, thermal, and mechanical properties associated with laminate material The metallic features can be copper or molybdenum features or other materials commonly used in the manufacture of semiconductor devices.

Figure 2C:
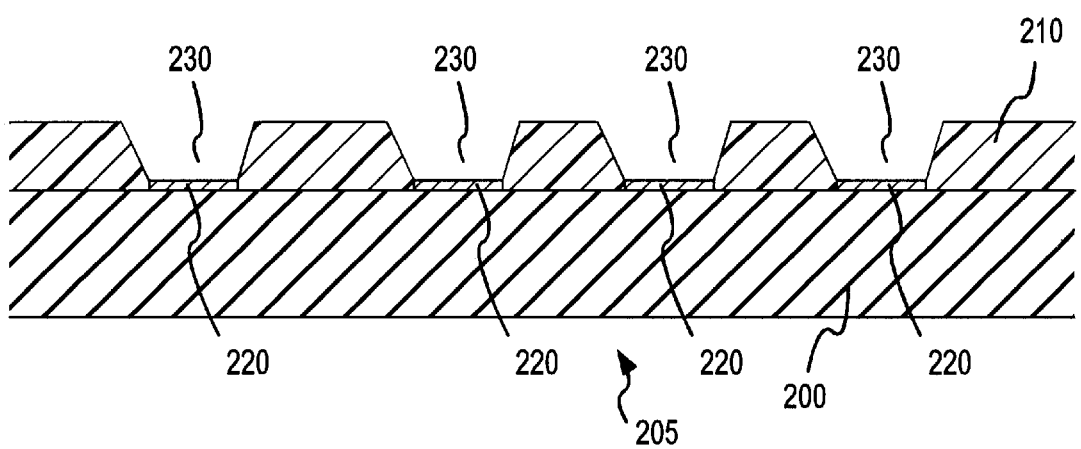

In the first embodiment, a SLC process is utilized and PCB core layer 200 is a FR4 printed wiring board, build-up layer 210 is a laminate material, and metallic features 220 are made from copper. Build-up layer 210 is approximately 35–100 microns thick, preferably 35–60 microns. As shown in FIG. 2c, microvias 230 to the PCB core layer are formed by exposure and developing of the laminate material. Microvias 230 preferably are formed over metallic features 220 so that the microvias can be plated. Microvias 230 are preferably 75–125 microns in diameter. Microvias 230 only extend through the thickness of one layer to the layer directly below.

Figure 2D:
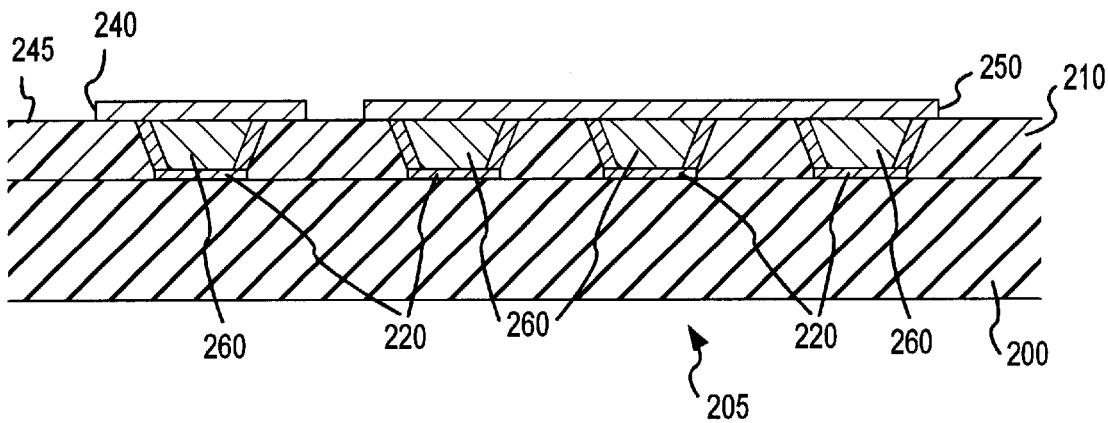

Microvias 230 are preferably plated with a metallic material such as copper as shown in FIG. 2d. Plating of the microvias is achieved using any of the traditional plating techniques such as full additive plating, full panel plate and etch, or pattern plating. If no electrical connectivity is required from the layer containing the microvia to the layer directly below, then the microvia does not have to be plated. In accordance with one embodiment of the present invention, bonding anchors 260 are formed by filling microvias 230 with a thermally conductive material such as solder mask, epoxy, or copper paste epoxy.

Figure 2E:
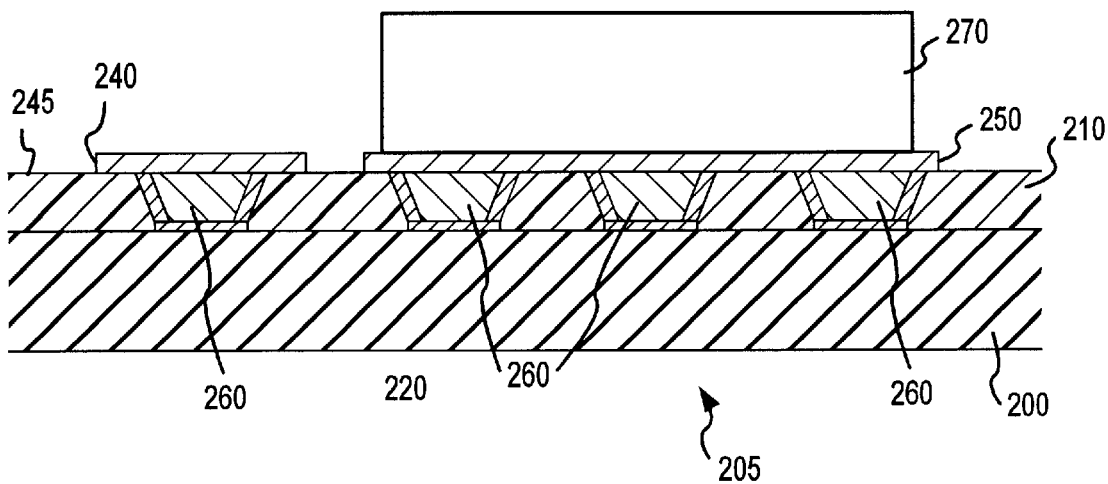
Figure 6:
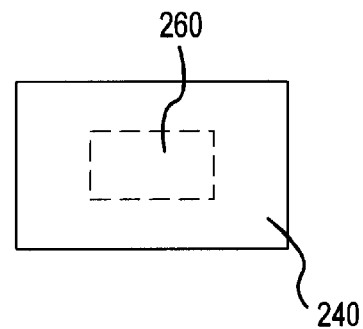

Bond pads 240 are formed on the upper surface 245 of build-up layer 210, as illustrated in FIG. 2e, such that one or more bond pad 240 are each positioned directly over an anchor 260. Referring momentarily to FIG. 6, in a preferred embodiment, bond pad 240 is positioned so that the bond pad is centered over anchor 260. Bond pads 240 may vary in size, but preferably the bond pad size is in the range of 125 microns by 250 microns to 200 microns by 250 microns. Only one bond pad is shown in FIG. 2d, but there may be any number of bond pads, as needed for the particular device being implemented. Bond pads 240 may be suitably plated with palladium or soft gold over nickel to facilitate an electrically and physically robust wire bond. A die attach pad 250 is formed on the upper surface 245 of build-up layer 210. Die attach pad 250 is a metallic pad formed of a metal that is highly conductive, both electrically and thermally. As described below, anchors 260 are used to provide electrical and thermal pathways, and mechanical stability, for bond pads 240 and die attach pad 250. As illustrated, a die attach pad may overlie more than one of the bonding anchors.

Referring to FIG. 2e, a semiconductor device chip 270 may be attached to die attach pad 250 in accordance with any number of suitable methodologies, such as conductive epoxy, solder, or the like. Of course, alternative attachment techniques may be employed depending upon the composition of build-up layer 210 and/or the material used for die attach pad 250.

In FIG. 2a, a fine wire 280 serves as an electrical connection between bond pads 240 and a suitable area on semiconductor device chip 270. Wire 280, in accordance with conventional wire bonding schemes, is typically gold or gold plated, aluminum or an alloy of aluminum, or copper or an alloy of copper. One method of wire bonding is high temperature thermal compression, whereby wire 280 is connected to bond pad 240 by heating to a high temperature (i.e., over 150 degrees C.) and applying mechanical pressure. Wire 280 is connected to semiconductor device chip 270 by a ball bond 290. Since anchors 260 extend from bond pad 240 and die attach pad 250 to the PCB core, anchors 260 provide a thermal pathway for the heat generated during wire bonding. The PCB core typically has a glass transition temperature that is higher than the temperature reached during wirebonding. Thus, the PCB core can act as a heat sink for the heat generated at bond pad 240. Anchors 260 will provide for a lower overall temperature of the surrounding buildup layer(s). It will be appreciated, that this will allow for materials, such as a laminate material, with a low glass transition temperature to be used for build-up layer 210. Only one wire bond is shown in FIG. 2a, but there may be any number of wire bonds from semiconductor device chip 270 to a plurality of bond pads 240.

Figure 3:
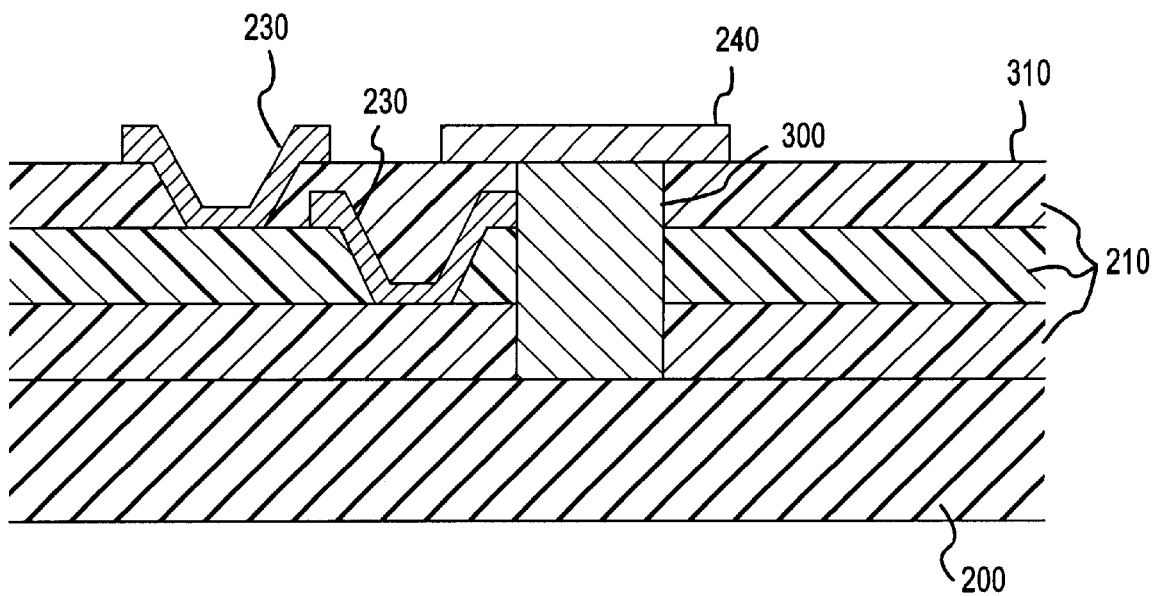
FIG. 3 illustrates, in cross section, a portion of an exemplary semiconductor device in accordance with an alternate embodiment of this invention.
Figure 4:
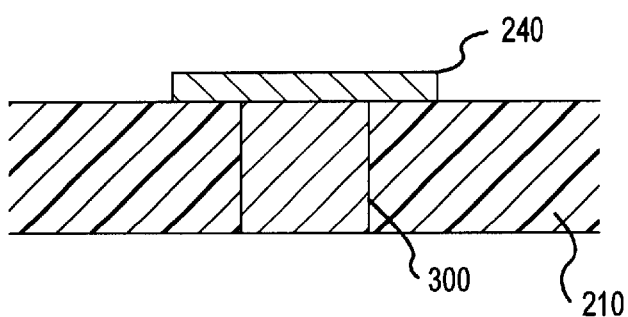
FIG. 4 illustrates, in cross section, an exemplary bonding anchor in accordance with an alternate embodiment of this invention.

In the exemplary embodiment illustrated in FIG. 3, the anchors may be formed by drilling holes through one or more build-up layers and filling the holes with a metallic material. A plurality of build-up layers 210 are formed over PCB core 200 in accordance with conventional techniques. As described above, build-up layers 210 and PCB core 200 may be formed from an organic (e.g., laminate) or an inorganic material. Microvias 230 may be present that connect one layer to the next layer immediately below. Small holes, preferably 75–125 microns in diameter, are laser or mechanically drilled through the plurality of build-up layers 210 from the upper surface 310 of the upper-most build-up layer to PCB core 200. Anchors 300 are then formed by filling the holes with a thermally conductive material such as solder mask, epoxy, or copper paste epoxy. Only one anchor is shown in FIG. 3, but there may be any number of anchors. Bond pad 240 is formed directly over anchor 300 so that the anchor provides mechanical stability and a thermal pathway for the bond pad. As illustrated in FIG. 4, anchor 300 may be formed by drilling a hole through a single build-up layer 210, and filling the hole with a metallic material as described above. In both embodiments, anchors 300 extend from the bonds pads to the PCB core to take advantage of the high glass transition temperature of the PCB core, and thus allow the PCB core to act as a heat sink for the heat generated during wire bonding.

Figure 5A:
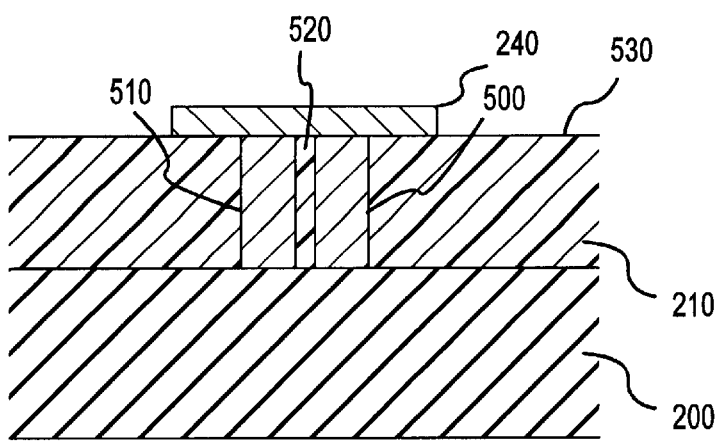
FIGS. 5a and 5b, illustrate in cross section and top view, respectively, an exemplary bonding or in accordance with an alternate embodiment of the present invention.
Figure 5B:
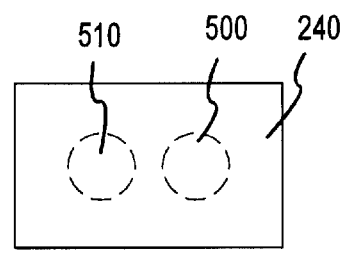

In another embodiment, the anchor may comprise two filled holes. For example, FIG. 5a illustrates an anchor 520 that is formed from two filled holes 500 and 510. A hole, preferably 50–100 microns in diameter is photo exposed or drilled through one or more build-up layers 210 to PCB core 200, and then another hole of approximately the same size is drilled adjacent to the first hole. Each hole is preferably plated with a metallic material and filled with a thermally conductive material as described above to form anchor 520. A plurality of anchors, through one or more buildup layers, can be formed in this manner. It will also be appreciated that each anchor can comprise any number of filled holes. Referring to FIGS. 5a and 5b, bond pad 240 is formed on upper surface 530 of build-up layer 210 so that bond pad 240 is centered over the anchor (depicted in phantom lines and comprising filled holes 500 and 510).

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A semiconductor device comprising:
   a PCB core layer;
   a build-up layer formed above said PCB core layer, said build-up layer having an upper surface;
   a thermally conductive anchor passing through the thickness of said build-up layer, said anchor contacting said PCB core layer;
   a die attach pad formed on said upper surface;
   a semiconductor device chip attached to said die attach pad;
   a bond pad formed on said upper surface, and located immediately above said anchor; and
   a wire connecting said semiconductor device chip to said bond pad.

2. The device of claim 1, wherein said bond pad is centered over said anchor.

3. The device of claim 1, wherein said build-up layer comprises an organic material.

4. The device of claim 1, wherein said build-up layer comprises a ceramic material.

5. The device of claim 1, wherein said build-up layer comprises a plurality of layers.

6. The device of claim 1, further comprising a plurality of thermally conductive anchors and wherein said die attach pad is located immediately above one or more of said anchors.

7. The device of claim 1, wherein said anchor comprises at least two posts.

8. A method for making a semiconductor device comprising the steps of:
   providing a PCB core layer;
   depositing a build-up layer having an upper surface overlying said PCB core layer;
   photodeveloping said build-up layer to form a predetermined pattern of microvias passing through the thickness of said build-up layer, said microvias contacting said PCB core layer;
   filling said microvias with a thermally conductive material to form a plurality of anchors;
   forming bonding pads on said upper surface, such that each of said bonding pads is positioned immediately above a different one of said anchors;
   forming a die attach pad on said upper surface;
   attaching a semiconductor device chip to said die attach pad; and
   wirebonding said device chip to said bonding pads.

9. The method of claim 8, wherein said step of wirebonding comprises high temperature wirebonding at temperatures over 150 degrees C.

10. The method of claim 8, wherein said step of forming a die attach pad comprises forming said die attach pad over one or more of said anchors.

11. A method for making a semiconductor device comprising the steps of:
    providing a PCB core layer;
    depositing a build-up layer having an upper surface overlying said PCB core layer;
    forming a plurality of holes through said build-up layer;
    filling said holes with a thermally conductive material to form a plurality of anchors;
    forming bonding pads on said upper surface, such that each of said bonding pads is positioned immediately above a different one of said anchors;
    forming a die attach pad on said upper surface;
    attaching a semiconductor device chip to said die attach pad; and
    wirebonding said device chip to said bonding pads.

12. The method of claim 11, wherein said step of wirebonding comprises high temperature wirebonding at temperatures over 150 degrees C.

13. The method of claim 11, wherein said step of depositing is repeated for a plurality of build-up layers.

14. The method of claim 13, wherein said step of forming a plurality of holes comprises forming said plurality of holes through said plurality of build-up layers.

15. The method of claim 11, wherein said step of forming a die attach pad comprises forming said die attach pad over one or more of said anchors.

16. The method of claim 11, wherein said step of forming a plurality of holes comprises drilling said holes through said build-up layer.

* * * * *